(12) United States Patent
Abella et al.

(10) Patent No.: US 8,578,137 B2
(45) Date of Patent: Nov. 5, 2013

(54) REDUCING AGING EFFECT ON REGISTERS

(75) Inventors: Jaume Abella, Barcelona (ES); Xavier Vera, Barcelona (ES); Antonio Gonzalez, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 1161 days.

(21) Appl. No.: 11/791,145

(22) PCT Filed: Nov. 3, 2006

(86) PCT No.: PCT/ES2006/070168
§ 371 (c)(1),
(2), (4) Date: May 18, 2007

(87) PCT Pub. No.: WO2008/053053
PCT Pub. Date: May 8, 2008

(65) Prior Publication Data
US 2009/0150656 A1    Jun. 11, 2009

(51) Int. Cl.
*G06F 12/00*    (2006.01)
(52) U.S. Cl.
USPC .......................... 712/225; 712/227
(58) Field of Classification Search
USPC .......................... 712/225, 32, 227
See application file for complete search history.

(56) References Cited

U.S. PATENT DOCUMENTS

| | | | |
|---|---|---|---|
| 4,724,518 A * | 2/1988 | Steps | 711/127 |
| 4,797,814 A | 1/1989 | Brenza | |
| 4,961,162 A * | 10/1990 | Nguyenphu et al. | 708/510 |
| 5,146,603 A | 9/1992 | Frost et al. | |
| 6,330,633 B1 | 12/2001 | Kusakabe et al. | |
| 6,373,753 B1 * | 4/2002 | Proebsting | 365/189.09 |
| 6,735,679 B1 | 5/2004 | Herbst et al. | |
| 6,792,500 B1 | 9/2004 | Herbst | |
| 6,865,127 B2 * | 3/2005 | Hasegawa et al. | 365/203 |
| 6,912,637 B1 | 6/2005 | Herbst | |
| 6,933,731 B2 * | 8/2005 | Reddy et al. | 324/612 |
| 6,933,869 B1 * | 8/2005 | Starr et al. | 341/120 |
| 7,310,281 B1 * | 12/2007 | Hsueh et al. | 365/222 |
| 7,395,373 B2 | 7/2008 | Robinson | |
| 7,576,569 B2 * | 8/2009 | Carpenter et al. | 327/14 |
| 2003/0198112 A1 | 10/2003 | Eleyan et al. | |
| 2005/0134360 A1 * | 6/2005 | Aipperspach et al. | 327/513 |

(Continued)

FOREIGN PATENT DOCUMENTS

| JP | 06-252696 | 9/1994 |
|---|---|---|
| WO | 2007137012 A1 | 11/2007 |
| WO | 2008053053 A1 | 5/2008 |

OTHER PUBLICATIONS

Kumar, Sanjay V. et al., Impact of NBTI on SRAM Read Stability and Design or Reliability, 2006,IEEE, Proceedings . of the 7th Intl. Symposium on Quality of Electronic Design, 8 pages.*

(Continued)

*Primary Examiner* — Eric Coleman
(74) *Attorney, Agent, or Firm* — Blakely, Sokoloff, Taylor & Zafman LLP (57) ABSTRACT

Methods and apparatus to reduce aging effect on registers are described. In one embodiment, a select value is stored in a register that is unused, for example, to reduce the effects of negative bias temperature instability (NBTI) or oxide degradation on the register. Other embodiments are also described.

27 Claims, 6 Drawing Sheets

(56) References Cited

U.S. PATENT DOCUMENTS

| | | | |
|---|---|---|---|
| 2005/0162969 | A1 | 7/2005 | Hasegawa et al. |
| 2005/0168255 | A1* | 8/2005 | Gauthier et al. ............. 327/161 |
| 2007/0233964 | A1 | 10/2007 | Robinson |
| 2007/0271421 | A1 | 11/2007 | Kim et al. |

OTHER PUBLICATIONS

International Search Report dated Aug. 1, 2007 for application No. PCT/ES2006/070168, 12 pgs.
"English Translation of the Substantive Portion of the International Search Report Issued by the Spanish Patent and Trademark Office on Aug. 1, 2007", PCT/ES2006/070168, 2 pgs.
International Search Report and Written Opinion for International Application PCT/US2007/068787, 10 pgs.
Non Final Office Action received for U.S. Appl. No. 11/435,701, mailed on Sep. 17, 2009, 18 pages.
Non Final Office Action received for U.S. Appl. No. 11/435,701, mailed on Oct. 6, 2008, 14 pages.
International Preliminary Report received for PCT Application No. PCT/US2007/068787, mailed on Nov. 17, 2008, 6 pages.
Non Final Office Action Received for U.S. Appl. No. 11/435,701, mailed on Apr. 3, 2009, 17 pages.
Office Action Received for Chinese Patent Application No. 200780017823.3, mailed on Aug. 20, 2010, 8 pages of Office Action and 4 pages of English translation.
Office Action Received for Korean Patent Application No. 10-2008-7028028, mailed on Sep. 30, 2010, 3 pages of Office Action and 2 pages of English translation.
Office Action Received for U.S. Appl. No. 11/435,701, mailed on May 26, 2010, 20 pages.
Abella, Jaume, et al., "NBTI-Resilient Memory Cells With NAND Gates", U.S. Appl. No. 11/611,344, filed Sep. 28, 2006, 35 pgs.
Alam, M.A., "A Critical Examination of the Mechanics of Dynamic NBTI for PMOSFETs", *Agere Systems*, 555 Union Blvd., Allentown, P.A. 18109, (2003), pp. 14.4.1-14.4.4.
Kim, Nam Sung, et al., "Reducing Aging Effect on Memory", U.S. Patent Appl. No. 11/435,701, filed May 17, 2006, 35 pgs.
Kumar, Sanjay V., et al., "Impact of NBTI on SRAM Read Stability and Design for Reliability", *ISQED06 Conference*, link to conference schedule: http://www.isqed.org/Archive/ISQED'06/Program/Session2C.htm, Dept. of Electrical and Computer Engineering, University of Minesota, Minneapolis, MN 55455, (Mar. 28, 2006), 6 pgs.
Schroder, D.K., et al., "Negative Bias Temperature Instability: A Road to Cross in Deep Submicron CMOS Manufacturing", *J. Appl. Phys. 94*, (Jul. 2003), pp. 1-18.
Wilerson, Chris, et al., "Method, System, and Apparatus for Detecting and Recovering From Timing Errors", U.S. Appl. No. 11/388,668, filed Mar. 23, 2006, 28 pgs.
Zhang, Youtao, et al., "Frequent Value Locality and Value-Centric Data Cache Design", *proc. of the 8th International Conference on Architectural Support for Programming Languages and Operating Systems*, (2000), 10 pgs.

\* cited by examiner

REDUCING AGING EFFECT ON REGISTERS

BACKGROUND

The present disclosure generally relates to the field of electronics. More particularly, an embodiment of the invention relates to reducing aging effect on registers in a processor.

As integrated circuit fabrication technology improves, semiconductor manufacturers are able to integrate additional functionality onto a single silicon substrate. As the number of these functionalities increases, however, so does the number of components on a single chip. Additional components may increase signal switching, in turn, generating more heat. The additional heat may damage various components of a chip. For example, memory devices that utilize p-channel metal-oxide semiconductor (P-MOS) transistors may be affected by the additional heat when the transistors are negatively biased over time, e.g., due to negative bias temperature instability (NBTI). Oxide degradation may also damage the transistors over time.

As memory devices degrade, their read or write stability may suffer, for example, due to shift in their gate threshold voltage. Designs may include margins to reduce the impact by such degradations, but the additional design margins may reduce performance and/or increase the requisite area to provide memory devices.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various mechanisms, such as integrated semiconductor circuits ("hardware"), computer-readable instructions organized into one or more programs ("software"), or some combination of hardware and software. For the purposes of this disclosure reference to "logic" shall mean either hardware, software, or some combination thereof. Also, the use of "instruction" or "micro-operation" (which may be referred to as "uop") herein may be interchangeable.

Some of the embodiments discussed herein may provide efficient mechanisms for reducing aging effect on storage units such as registers (for example, due to NBTI and/or oxide degradation). In an embodiment, such effects may be reduced by storing a select value in the storage units after the storage units are released. The use of the term "released" herein with reference to a storage unit (such as a register) may also be interchangeable with the terms "unused" or "idle." The select value may be updated such that it causes the switching of the voltage bias on the gates of transistors of a bit cell (for example, the bit cell may be implemented as cross-coupled inverters in an embodiment) that are utilized in storage devices (such as a register) over time, e.g., by balancing the amount of time a transistor is biased negatively versus positively. Such periodic switching may reduce the effects of NBTI and/or oxide degradation on the registers utilized in a processor, such as the processors discussed with reference to FIGS. 1-7. For example, some embodiments may allow all or some of the bits cells of a register utilized in a processor to spend close to 50% of the corresponding processor execution unit's operation time in negatively biased state and the remaining amount of time (e.g., close to 50%) in a positively biased state.

Figure 1:
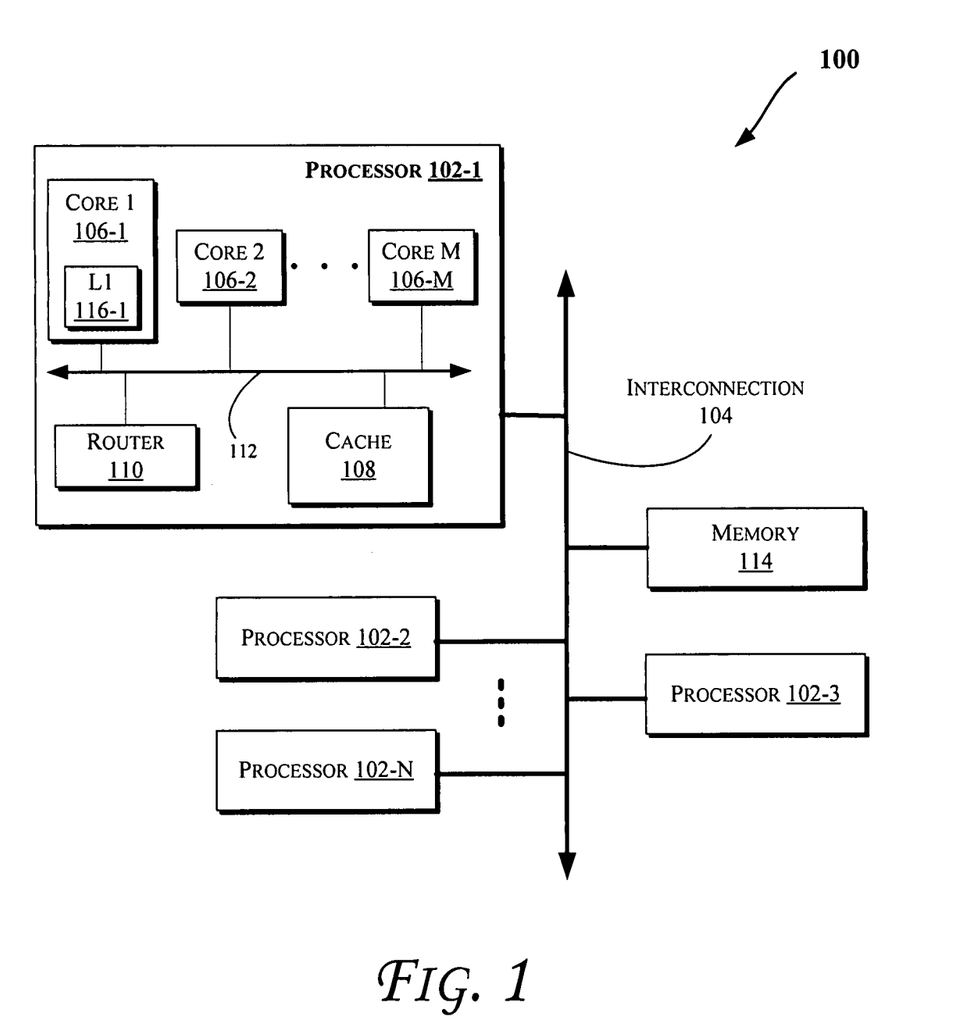
FIGS. 1, 6, and 7 illustrate block diagrams of embodiments of computing systems, which may be utilized to implement various embodiments discussed herein.

More particularly, FIG. 1 illustrates a block diagram of a computing system 100, according to an embodiment of the invention. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers, or other components.

In one embodiment, the router 110 may be used to communicate between various components of the processor 102-1 and/or system 100. Moreover, the processor 102-1 may include more than one router 110. Furthermore, the multitude of routers (110) may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a memory 114 for faster access by the components of the processor 102-1. As shown in FIG. 1, the memory 114 may be in communication with the processors 102 and/or cores 106 via the interconnections 104 and 112. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

Figure 2:
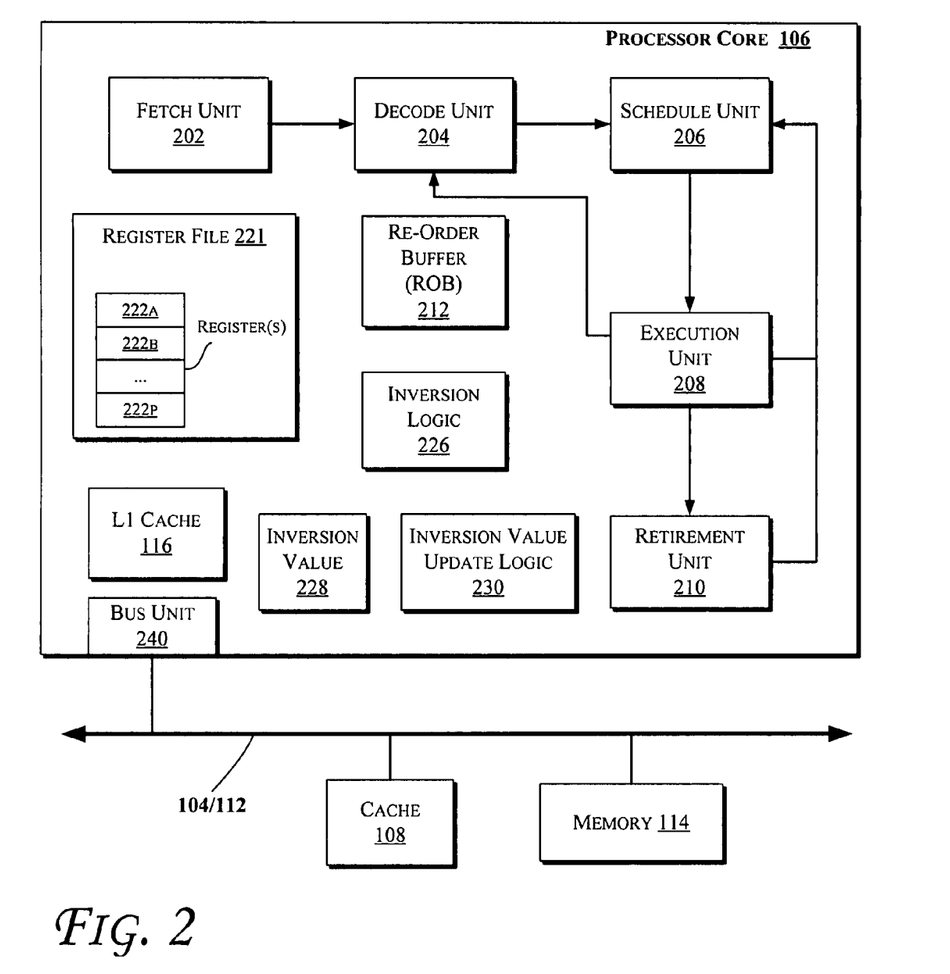
FIG. 2 illustrates a block diagram of portions of a processor core, according to an embodiment of the invention.

FIG. 2 illustrates a block diagram of portions of a core 106, according to an embodiment of the invention. In one embodiment, the arrows shown in FIG. 2 illustrate the flow direction of instructions through the core 106. One or more processor cores (such as the processor core 106) may be implemented on a single integrated circuit chip (or die) such as discussed with reference to FIG. 1. Moreover, the chip may include one or more shared and/or private caches (e.g., cache 108 of FIG. 1), interconnections (e.g., interconnections 104 and/or 112 of FIG. 1), memory controllers, or other components.

As illustrated in FIG. 2, the processor core 106 may include a fetch unit 202 to fetch instructions for execution by the core 106. The instructions may be fetched from any storage devices such as the memory 114 and/or the memory devices discussed with reference to FIGS. 6 and 7. The core 106 may also include a decode unit 204 to decode the fetched instruction. For instance, the decode unit 204 may decode the fetched instruction into a plurality of uops (micro-operations). Additionally, the core 106 may include a schedule unit 206. The schedule unit 206 may perform various operations associated with storing decoded instructions (e.g., received from the decode unit 204) until the instructions are ready for dispatch, e.g., until all source values of a decoded instruction become available. In one embodiment, the schedule unit 206 may schedule and/or issue (referred to generically herein as "dispatch") decoded instructions to various components of the processor core 106 for execution, such as an execution unit 208. The execution unit 208 may execute the dispatched instructions after they are decoded (e.g., by the decode unit 204) and dispatched (e.g., by the schedule unit 206). In an embodiment, the execution unit 208 may include more than one execution unit, such as a memory execution unit, an integer execution unit, a floating-point execution unit, or other execution units. The execution unit 208 may also perform various arithmetic operations such as addition, subtraction, multiplication, and/or division, and may include one or more arithmetic logic units (ALUs). In an embodiment, a co-processor (not shown) may perform various arithmetic operations in conjunction with the execution unit 208.

Further, the execution unit 208 may execute instructions out-of-order. Hence, the processor core 106 may be an out-of-order processor core in one embodiment. The core 106 may also include a retirement unit 210. The retirement unit 210 may retire executed instructions after they are committed. In an embodiment, retirement of the executed instructions may result in processor state being committed from the execution of the instructions, physical registers used by the instructions being de-allocated or released, etc.

The core 106 may additionally include a reorder buffer (ROB) 212 to store information about in-flight instructions (or uops) for access by various components of the processor core 106. In one embodiment, entries within the ROB 212 may correspond (e.g., point) to registers in a register file 221 (e.g., including registers 222A through 222P, which may be collectively referred to herein as "registers 222" or more generally "register 222"). For example, entries of the ROB 212 may store information about registers 222 that are accessed by in-flight instructions (or uops) and at commitment or retirement of an instruction (e.g., by the retirement unit 210), one register identified in ROB 212 may be released. Hence, the information stored in the ROB 212 may be used as an indication that a register is to be released. In an embodiment, each bit cell of the registers 222 may include at least two transistors to store one bit of data. In one embodiment, each bit cell of the registers 222 may include a plurality of p-channel metal-oxide semiconductor (P-MOS) and/or n-channel metal-oxide semiconductor (N-MOS) transistors that are coupled (e.g., to form two cross-coupled inverters). In one embodiment, the registers 222 may be implemented by using static random access memory (SRAM) devices. Also, NAND gates may be utilized to implement the bit cells of the registers 222.

In an embodiment, the core 106 may include an inversion logic 226 to cause storage of a select value in a storage unit (e.g., such as the registers 222) after an indication that the storage unit is to be released (e.g., by reference to a corresponding entry of the ROB 212 or a signal generated by the ROB 212, for example). The select value caused to be stored by the logic 226 (which may be referred to herein as an "inversion value") may be stored in a storage unit 228 (which may be a register in an embodiment). Also, the inversion value may be stored as a variable in a shared storage unit such as the L1 cache 116 and/or the memory 114. The inversion value 228 may include more than one value, e.g., comprising for example a floating-point value and/or an integer value. The core 106 may further include an inversion value update logic 230 to update the inversion value stored in the unit 228. The logic 230 may select or compute the inversion value from various sources such values written to one of the registers 222 (or the inverted versions of the values written to one of the registers 222 in an embodiment). Also, the logic 230 may update the inversion value (228) on a periodic basis in an embodiment.

The core 106 may also include a bus unit 240 to allow communication between components of the processor core 106 and other components (such as the components discussed with reference to FIG. 1 including cache 108 and/or memory 114) via one or more buses (e.g., buses 104 and/or 112).

Figure 3:
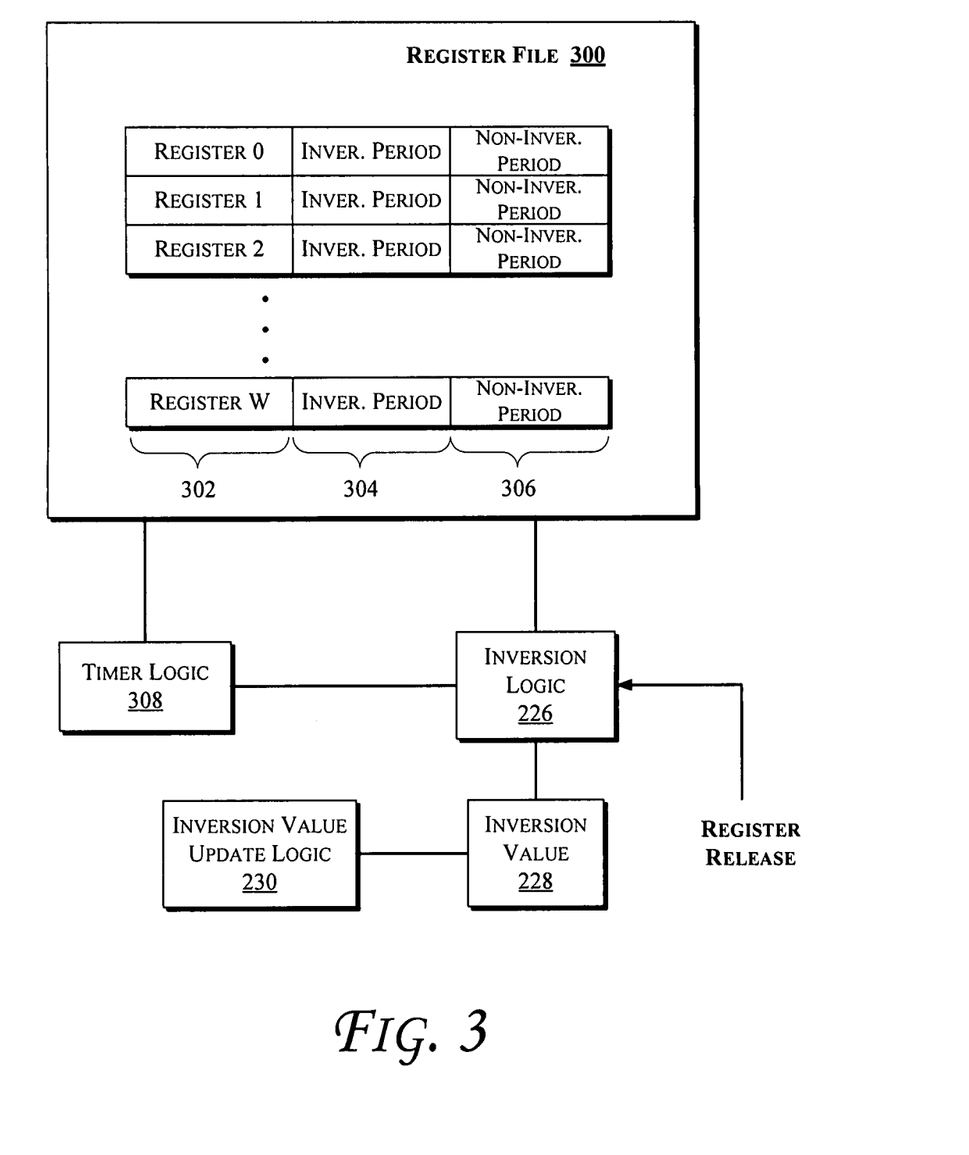
FIG. 3 illustrates a block diagram of portions of a register file and other components of a processor core, according to an embodiment of the invention.

FIG. 3 illustrates a block diagram of portions of a register file 300 and other components of a processor core, according to an embodiment of the invention. In one embodiment, the register file 300 may be the same as or similar to the register file 221 discussed with reference to FIG. 2. As shown in FIG. 3, the register file 300 may include one or more register(s) 302 (which may be the same or similar to the registers 222 of FIG. 2). As shown in FIG. 3, each of the registers 302 may have a corresponding inverted period field 304 (e.g., to indicate how long the corresponding register has stored or maintained an inverted value) and a non-inverted period field 306 (e.g., to indicate how long the corresponding register has stored or maintained a non-inverted value). In one embodiment, both fields 304 and 306 may be represented by a single field (e.g., implemented as a counter in an embodiment). For example, a single counter may be incremented (e.g., by the logic 308) in accordance with the length of inverted periods and decremented (e.g., by the logic 308) with the length of non-inverted periods. This approach may reduce the need for relatively large counters. Alternatively, the register file 300 may include the fields 304 and/or 306 only for one ore more of the registers 302. Moreover, a timer logic 308 may update the values stored in the fields 304 and/or 306, as will be further discussed herein, e.g., with reference to FIG. 5. In an embodiment, the logic 308 may update the values stored in the fields 304 and/or 306 by utilizing timestamps (e.g., which may be stored in the register file 300 for each corresponding register 302, for example). The timestamps may record each time a corresponding register starts and/or stops storing an inverted or a non-inverted value as will be further discussed with reference to FIG. 5. In one embodiment, timestamps may be generated for one or more of the registers 302 (e.g., a single register). Furthermore, the register for which the timestamps may be generated may be a fixed register, or a register chosen by random selection, round-robin, etc.

Additionally, as illustrated in FIG. 3, the register file 300 may communicate via one or more of the logics 226 and/or 308 to update values stored in the register(s) 302, field(s) 304, and/or field(s) 306. As discussed with reference to FIG. 2, the inversion value 228 may be updated by the logic 230 and the logic 226 may store the inversion value 228 into one or more of the registers 302 after the registers are released.

Figure 4:
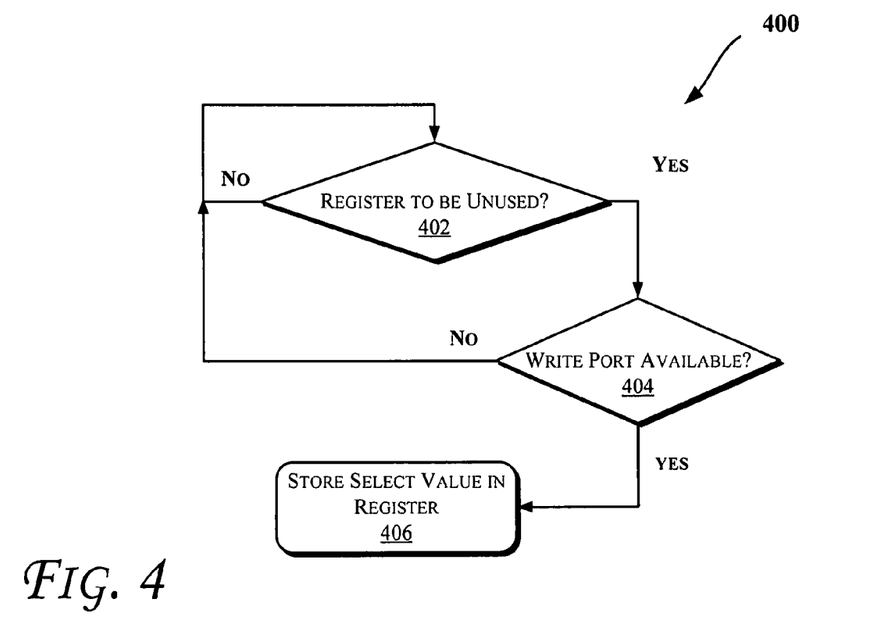
FIGS. 4 and 5 illustrate flow diagrams of embodiments of methods, in accordance with some embodiments of the invention.

FIG. 4 illustrates a flow diagram of an embodiment of a method 400 to store a select value in a storage unit, in accordance with an embodiment of the invention. In an embodiment, various components discussed with reference to FIGS. 1-3 and 6-7 may be utilized to perform one or more of the operations discussed with reference to FIG. 4. For example, the method 400 may be used to store data in one or more of the registers 222 of FIG. 2 and/or registers 302 of FIG. 3.

Referring to FIGS. 1-4, at an operation 402, it may be determined whether a storage unit (e.g., such as one of the registers 222 and/or 302) are to be unused. In an embodiment, the operation 402 may be performed with reference to a corresponding entry of the ROB 212 such as discussed with reference to FIG. 2. The method 400 continues with the operation 402 until it is detected that the storage unit is going to be unused. Once the operation 402 determines that a storage unit is to be unused, at an operation 404, it is determined whether a port is available for writing data to a storage unit (e.g., whether a write port is available to write data to one of the registers 222 and/or 302). If a write port is available at operation 404, a select value may be stored in the storage unit (e.g., inversion value 228 may be stored in one of the registers 222 and/or 302 by the logic 226).

Figure 5:
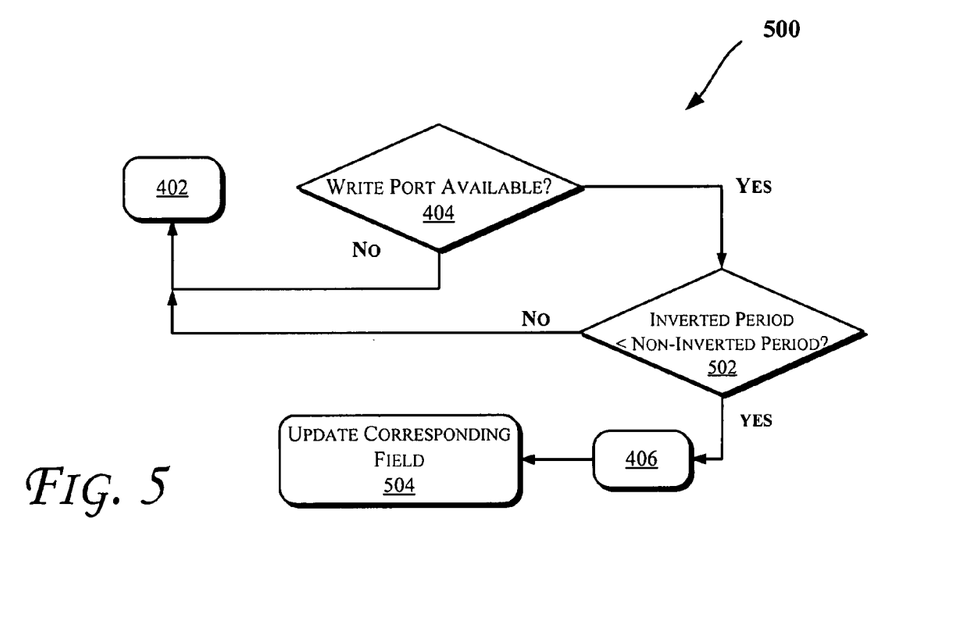

FIG. 5 illustrates a flow diagram of an embodiment of a method 500 to update one or more fields and store a select value in a storage unit, in accordance with an embodiment of the invention. In an embodiment, various components discussed with reference to FIGS. 1-3 and 6-7 may be utilized to perform one or more of the operations discussed with reference to FIG. 5. For example, the method 500 may be used to update the values stored in the fields 304 and/or 306 and/or store data in one or more of the registers 222 of FIG. 2 and/or registers 302 of FIG. 3.

Referring to FIGS. 1-5, after the operation 404 (e.g., once it is determined that a write port is available), at an operation 502, it may be determined whether the storage unit discussed with reference to operation 402 has stored or maintained an inverted value for a shorter period than a non-inverted value. In an embodiment, the operation 502 may be performed by the logic 308 by reference to the fields 304 and/or 306 corresponding to the register 302 discussed with reference to operation 402 (e.g., which is to be released). After determining that the storage unit has stored a non-inverted value for a longer period than an inverted value at operation 502, the method 500 may continue with the operation 406. After operation 406, the method 500 (at an operation 504) may update the value(s) stored in the corresponding timer fields, e.g., to indicate that the corresponding storage unit is storing the inversion value 228. In an embodiment, the fields 304 and/or 306 may include various other fields to store a timestamp corresponding to when an inverted value and/or a non-inverted value is stored and subsequently replaced by a different value to enable the logic 308 to determine the time period one or more of the registers 302 store the corresponding values. Furthermore, as shown in FIG. 5, if operations 404 or 502 return a negative response, the method 500 may resume with the operation 402.

Figure 6:
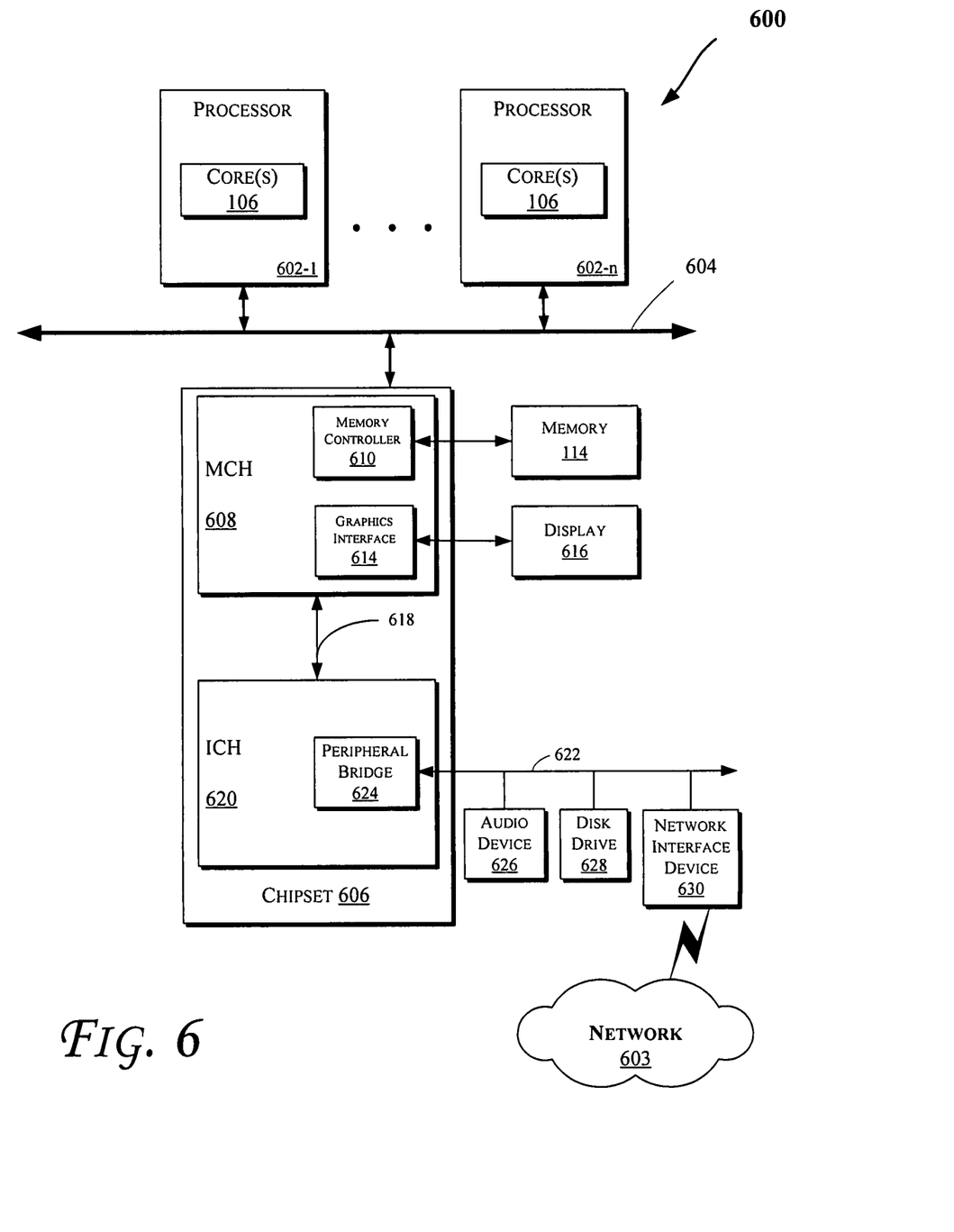

FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1. For example, one or more of the processors 602 may include one or more of the cores 106 discussed with reference to FIG. 1. Also, the operations discussed with reference to FIGS. 1-5 may be performed by one or more components of the system 600.

A chipset 606 may also communicate with the interconnection network 604. The chipset 606 may include a memory control hub (MCH) 608. The MCH 608 may include a memory controller 610 that communicates with the memory 114. The memory 114 may store data, including sequences of instructions, which may be executed by the CPU 602, or any other device included in the computing system 600. In one embodiment of the invention, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and the MCH 608 may be combined to form a single chip. Furthermore, a graphics accelerator may be included within the MCH 608 in other embodiments of the invention.

Furthermore, the computing system 600 may include volatile and/or nonvolatile memory (or storage unit). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
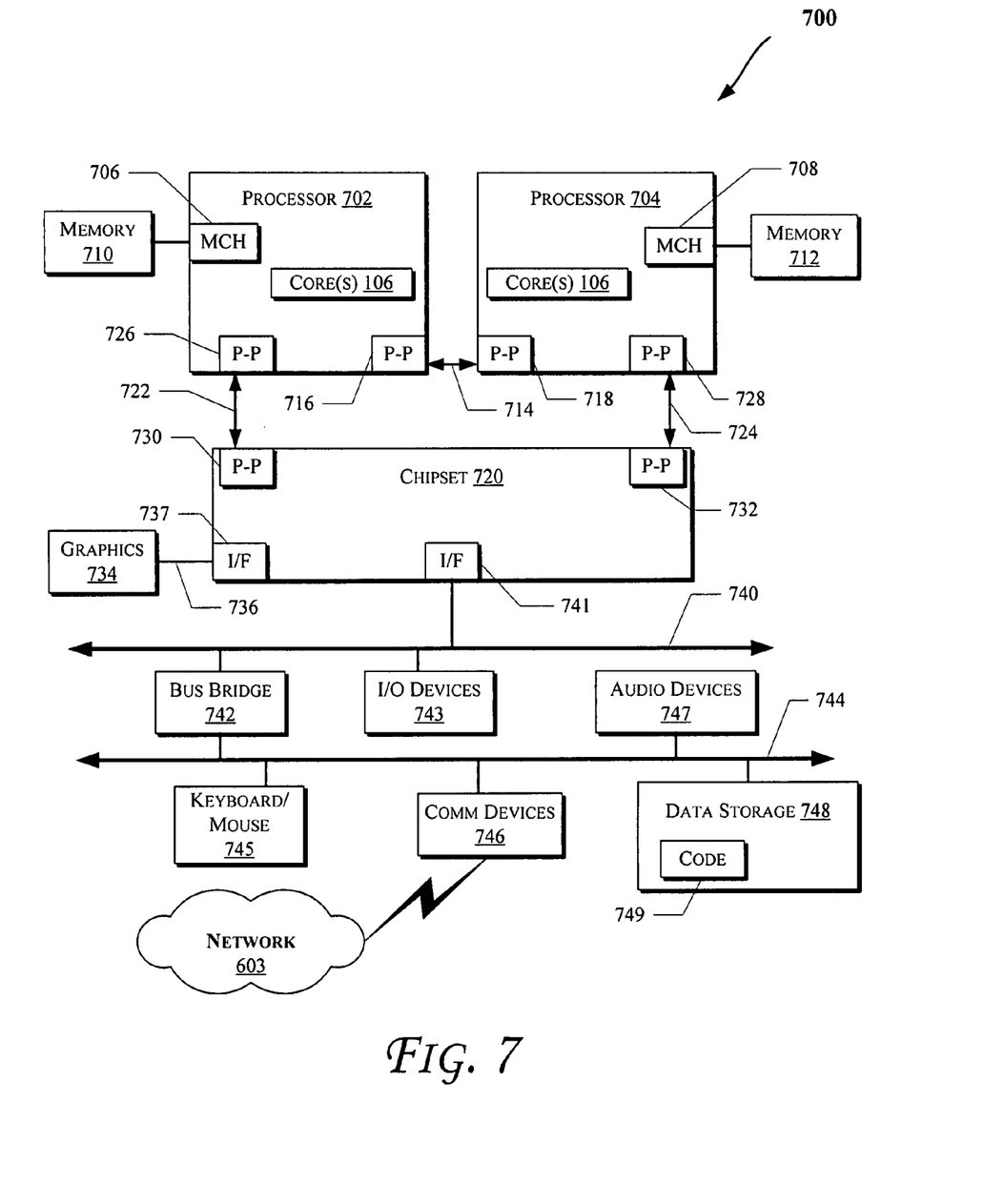

FIG. 7 illustrates a computing system 700 that is arranged in a point-to-point (PtP) configuration, according to an embodiment of the invention. In particular, FIG. 7 shows a system where processors, memory, and input/output devices are interconnected by a number of point-to-point interfaces. The operations discussed with reference to FIGS. 1-6 may be performed by one or more components of the system 700.

As illustrated in FIG. 7, the system 700 may include several processors, two of which (processors 702 and 704) are shown for clarity. The processors 702 and 704 may each include a local memory controller hub (MCH) 706 and 708 to enable communication with memories 710 and 712. The memories 710 and/or 712 may store various data such as those discussed with reference to the memory 114 of FIGS. 1, 2, and 6.

In an embodiment, the processors 702 and 704 may be one of the processors 602 discussed with reference to FIG. 6. The processors 702 and 704 may exchange data via a point-to-point (PtP) interface 714 using PtP interface circuits 716 and 718, respectively. Also, the processors 702 and 704 may each exchange data with a chipset 720 via individual PtP interfaces 722 and 724 using point-to-point interface circuits 726, 728, 730, and 732. The chipset 720 may further exchange data with a graphics circuit 734 via a graphics interface 736, e.g., using a PtP interface circuit 737.

At least one embodiment of the invention may be provided within the processors 702 and 704. For example, one or more of the core 106 of FIGS. 1 may be located within the processors 702 and 704. Other embodiments of the invention, however, may exist in other circuits, logic units, or devices within the system 700 of FIG. 7. Furthermore, other embodiments of the invention may be distributed throughout several circuits, logic units, or devices illustrated in FIG. 7.

The chipset 720 may communicate with a bus 740 using a PtP interface circuit 741. The bus 740 may communicate with one or more devices, such as a bus bridge 742 and I/O devices 743. Via a bus 744, the bus bridge 742 may communicate with other devices such as a keyboard/mouse 745, communication devices 746 (such as modems, network interface devices, or other communication devices that may communicate with the computer network 603), audio I/O device 747, and/or a data storage device 748. The data storage device 748 may store code 749 that may be executed by the processors 702 and/or 704.

In various embodiments of the invention, the operations discussed herein, e.g., with reference to FIGS. 1-7, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed with respect to FIGS. 1-7.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Reference in the specification to "one embodiment," "an embodiment," or "some embodiments" means that a particular feature, structure, or characteristic described in connection with the embodiment(s) may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A processor comprising:
   a register to store data;
   a counter to store a first value to indicate a dynamic time amount of how long a portion of the register has maintained an inverted versus a non-inverted value; and
   a first logic to cause storage of a second value in the register in response to a detection that the register is to be released, wherein the first logic causes storage of the second value in the register in response to the first value indicating that the portion of the register has maintained an inverted value for a shorter time period than a non-inverted value.

2. The processor of claim 1, further comprising a second logic to update the second value on a periodic basis.

3. The processor of claim 1, further comprising a register file that comprises the register.

4. The processor of claim 3, further comprising a second logic to update the second value based on a value, written to one of a plurality of registers in the register file.

5. The processor of claim 1, further comprising a second logic to update the first value based on one or more accesses to the storage unit.

6. The processor of claim 1, wherein the storage unit comprises a plurality of bit cells and each bit cell of the storage unit comprises at least two transistors to store a bit of the data.

7. The processor of claim 1, wherein the storage unit comprises a static random access memory (SRAM) device.

8. The processor of claim 1, further comprising one or more processor cores, wherein at least one of the processor cores comprises the logic.

9. A method comprising:
   detecting whether a register is released; and
   storing a value in the register based on how long the register has stored an inverted value and a non-inverted value.

10. The method of claim 9, further comprising updating the stored value after determining that the register has stored an inverted value for a shorter time period than a non-inverted value.

11. The method of claim 9, further comprising updating the value on a periodic basis.

12. The method of claim 9, further comprising updating the value based on a value written to one of a plurality of registers in a register file.

13. The method of claim 9, wherein the storing is performed in response to a determination that a write port is available to write the value into the register.

14. A computing system comprising:
   a memory to store data; and
   a processor core comprising:
      a register to store a portion of the data stored in the memory, wherein the register includes an inverted period field to store a value indicating how long the register has stored an inverted value and a non-inverted period field to store a value indicating how long the register has stored a non-inverted value; and
      logic to cause storage of a value in the register in response to a detection that the register is to be released, wherein the logic causes storage of the value in the register in response to an indication that the register has maintained an inverted value for a shorter time period than a non-inverted value.

15. The system of claim 14, wherein the memory comprises a cache.

16. The system of claim 14, wherein the register comprises a plurality of p-channel metal-oxide semiconductor (P-MOS) or n-channel metal-oxide semiconductor (N-MOS) transistors.

17. The system of claim 14, further comprising logic to update the stored value based on a value written to one of a plurality of registers in a register file, wherein the register file comprises the register.

18. The system of claim 14, further comprising logic to update the stored value on a periodic basis.

19. The system of claim 14, further comprising a plurality of processor cores to access the data stored in the memory.

20. The system of claim 14, further comprising an audio device.

21. An apparatus comprising:
   a first logic unit to invert values stored in a first register when the first register is not storing data to be used by a second logic unit; and
   a second register to store inverted values to be stored in the first register to reduce an aging effect of the first register.

22. The apparatus of claim 21, wherein the first logic is to invert the values stored in the first register according to a first inversion period.

23. The apparatus of claim 22, wherein the inverted values are to be stored in the first register only if a write port to the first register is available.

24. The apparatus of claim 22, wherein the second logic includes a processor execution unit.

25. The apparatus of claim 24, wherein the first inversion period corresponds to 50% of the processor execution unit's operation time.

26. The apparatus of claim 22, wherein the first logic includes an inversion logic and an inversion value update logic.

27. The apparatus of claim 22, wherein the first inversion period is to be measured by a first inversion counter coupled to the first register.

* * * * *